United States Patent
Kimura et al.

(10) Patent No.: US 10,852,552 B2
(45) Date of Patent: Dec. 1, 2020

(54) IMAGE PROJECTION OPTICAL MODULE AND HEAD MOUNTED DISPLAY

(71) Applicant: HITACHI-LG DATA STORAGE, INC., Tokyo (JP)

(72) Inventors: Katsuhiko Kimura, Tokyo (JP); Kazuhiko Kuzumaki, Tokyo (JP)

(73) Assignee: HITACHI-LG DATA STORAGE, INC., Tokyo (JP)

( * ) Notice: Subject to any disclaimer, the term of this patent is extended or adjusted under 35 U.S.C. 154(b) by 0 days.

(21) Appl. No.: 16/439,772

(22) Filed: Jun. 13, 2019

(65) Prior Publication Data

US 2020/0073125 A1 Mar. 5, 2020

(30) Foreign Application Priority Data

Aug. 31, 2018 (JP) ................... 2018-162820

(51) Int. Cl.
| | | |
|---|---|---|
| *G02B 27/01* | (2006.01) | |
| *G03B 21/16* | (2006.01) | |
| *H05K 7/20* | (2006.01) | |
| *G03B 21/14* | (2006.01) | |

(52) U.S. Cl.
CPC ....... *G02B 27/0172* (2013.01); *G03B 21/142* (2013.01); *G03B 21/16* (2013.01); *H05K 7/20954* (2013.01)

(58) Field of Classification Search
None
See application file for complete search history.

(56) References Cited

U.S. PATENT DOCUMENTS

| | | | |
|---|---|---|---|
| 10,261,555 B1* | 4/2019 | Cooper | G06F 1/20 |
| 10,416,735 B2* | 9/2019 | Ali | H05K 7/2039 |
| 2015/0177522 A1* | 6/2015 | Yajima | G09G 3/3233 345/8 |
| 2016/0041395 A1* | 2/2016 | Yajima | G02B 27/0176 359/630 |
| 2016/0212879 A1* | 7/2016 | Nikkhoo | H05K 7/2039 |
| 2016/0212888 A1* | 7/2016 | Nikkhoo | G02B 27/0176 |
| 2016/0255748 A1* | 9/2016 | Kim | G02B 27/0176 361/695 |
| 2017/0184863 A1* | 6/2017 | Balachandreswaran | G02B 27/0176 |
| 2018/0307282 A1* | 10/2018 | Allin | G06F 1/203 |
| 2019/0104650 A1* | 4/2019 | McGinty | G06F 1/1637 |

FOREIGN PATENT DOCUMENTS

JP 2016-039520 A 3/2016

* cited by examiner

*Primary Examiner* — Courtney L Smith
(74) *Attorney, Agent, or Firm* — Volpe Koening

(57) ABSTRACT

An image projection optical module including: an image generating element configured to generate an image; an image display unit configured to display the image; and a coupling member thermally connected to the image generating element, the coupling member including a front heat dissipation portion on a front portion of the coupling member when a direction of line of sight of a user wearing a casing of a head mounted display provided with the image projection optical module is defined as a forward direction, the front heat dissipation portion being to dissipate heat.

15 Claims, 12 Drawing Sheets

IMAGE PROJECTION OPTICAL MODULE AND HEAD MOUNTED DISPLAY

BACKGROUND OF THE INVENTION

1. Field of the Invention

The present invention relates to an image projection optical module including a head mounted display and a head mounted display.

2. Description of the Related Art

A head mounted display is known as a device for displaying information such as characters and video images while worn on the user's head. Such a head mounted display includes: an image projection optical module including a light source, an image generating element, and an image display unit; a control circuit; a battery; and a casing for housing these elements. The heating value of such a device tends to increase with increase in the definition and intensity of an image to be displayed and increase in the amount of information for external communication. As a result, there has been required to inhibit a rise in the temperature of the device due to the increase in the heating value.

As background art in this technical field, JP 2016-39520 A discloses a display device in which display panels are supported by panel frames, respectively, and upper plates of the panel frames adhere to lower faces of temple portions through a thermal conductive adhesive, respectively, whereby heat generated from the display panels conducts to the panel frames to dissipate externally. (Refer to claim 6.)

SUMMARY OF THE INVENTION

Since a head mounted display is worn on the head, there is required inhibition of a rise in the temperature of a casing in contact with or close to the head, in addition to efficient external dissipation of heat generated from a light source and an image generating element. In particular, the head side of the casing of the head mounted display constantly is in contact with or close to the head during use, so that the influence on the human body due to the rise in the temperature is large. On the other hand, although the outer surface side of the casing of the head mounted display can be touched by hand, the time is limited, and a rise in the temperature is allowable to some extent as compared with the head side. Therefore, it is important to enhance the heat dissipation from the light source and the image generating element and inhibit a rise in temperature on the head side of the casing of the head mounted display.

Although allowing the temperature of the display to lower in such a manner of conducting the heat generated from the display panel to the temple portions, JP 2016-39520 A disclosed above has no consideration for inhibition of a rise in the temperature of the temple portions to be in contact with the head.

An object of the present invention is to provide an image projection optical module for a head mounted display, the image projection optical module inhibiting a rise in temperature on the head side of a casing of the head mounted display while efficiently dissipating heat generated from an image generating element and the like.

As an example of the "image projection optical module" of the present invention in order to achieve the above object, an image projection optical module including: an image generating element configured to generate an image; an image display unit configured to display the image; and a coupling member thermally connected to the image generating element, the coupling member including a front heat dissipation portion on a front portion of the coupling member when a direction of line of sight of a user wearing a casing of a head mounted display provided with the image projection optical module is defined as a forward direction, the front heat dissipation portion being to dissipate heat.

According to the present invention, there can be provided an image projection optical module for a head mounted display, the image projection optical module dissipating heat generated from an image generating element of the image projection optical module and the like to a front portion of a casing of the head mounted display, to allow reduction in heat transfer to the head side of the casing of the head mounted display, thereby inhibiting a rise in temperature on the head side of the casing of the head mounted display.

DESCRIPTION OF THE PREFERRED EMBODIMENTS

Figure 1:
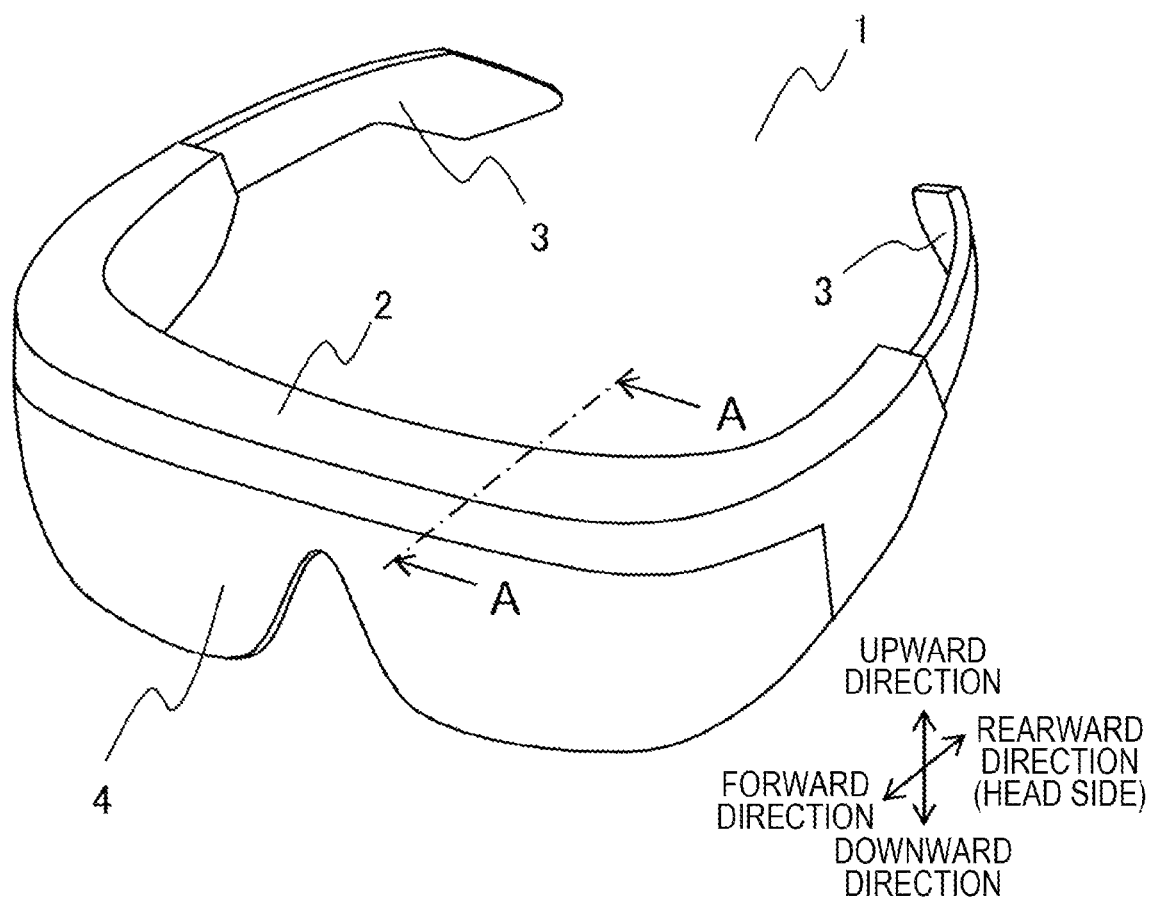
FIG. 1 is an external perspective view of a head mounted display including an image projection optical module according to a first embodiment of the present invention.

Embodiments of the present invention will be described below with reference to the drawings. Note that, in the drawings for explaining the embodiments, the same names and reference numerals are given to the same constituent elements as much as possible, and the repetitive description thereof will be omitted.

First Embodiment

FIG. 1 is an external perspective view of a head mounted display 1 including an image projection optical module according to a first embodiment of the present invention. The head mounted display 1 includes a casing 2 internally provided with an image projection optical module to be described later, a head wearing portion 3 to be worn on the head of the user of the head mounted display 1, and a front shield 4 for covering ahead of the user's eyes. A control circuit and a battery (not illustrated) are housed inside the casing 2 or the head wearing portion 3. Note that with the user wearing the head mounted display 1, the head top side of the user is defined as an upward direction, the direction of the line of sight of the user as a forward direction, and a rearward direction opposite thereto as the head side.

Figure 2:
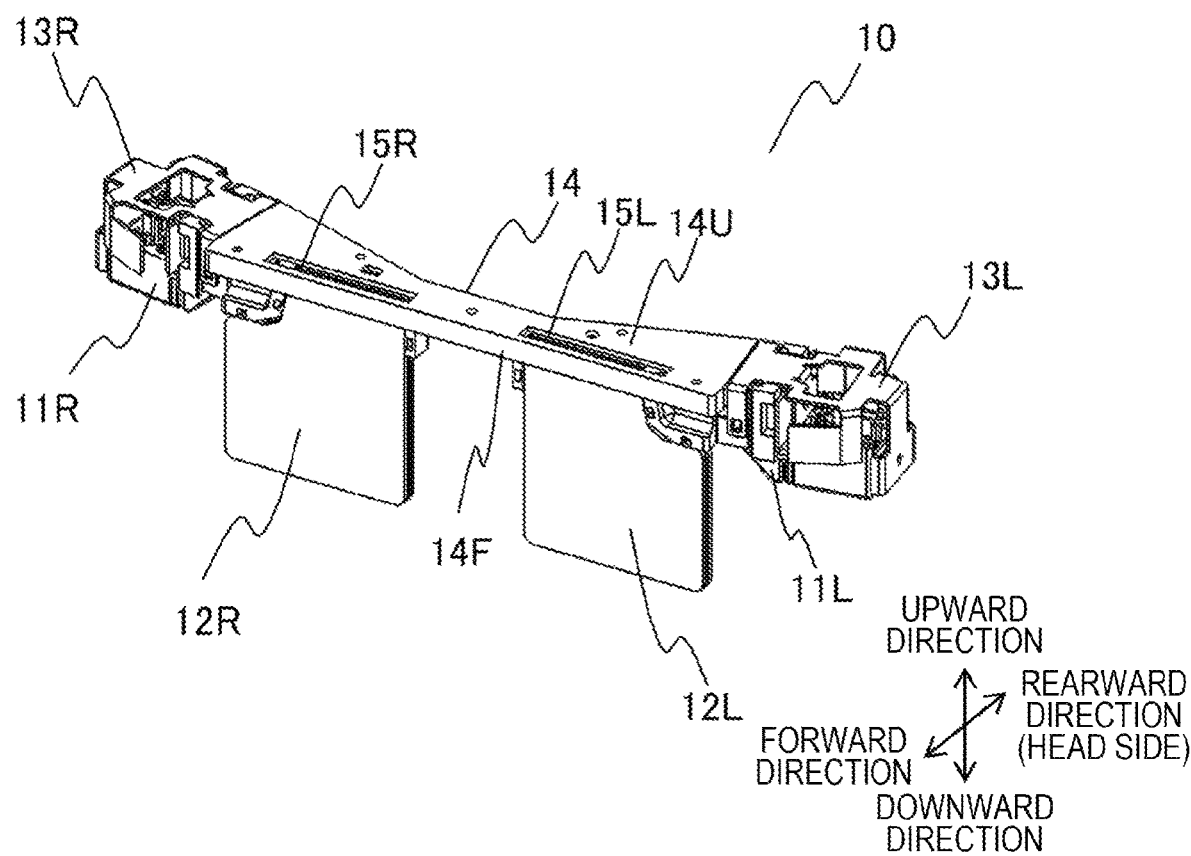
FIG. 2 is a perspective view of the image projection optical module according to the first embodiment of the present invention.
Figure 3:
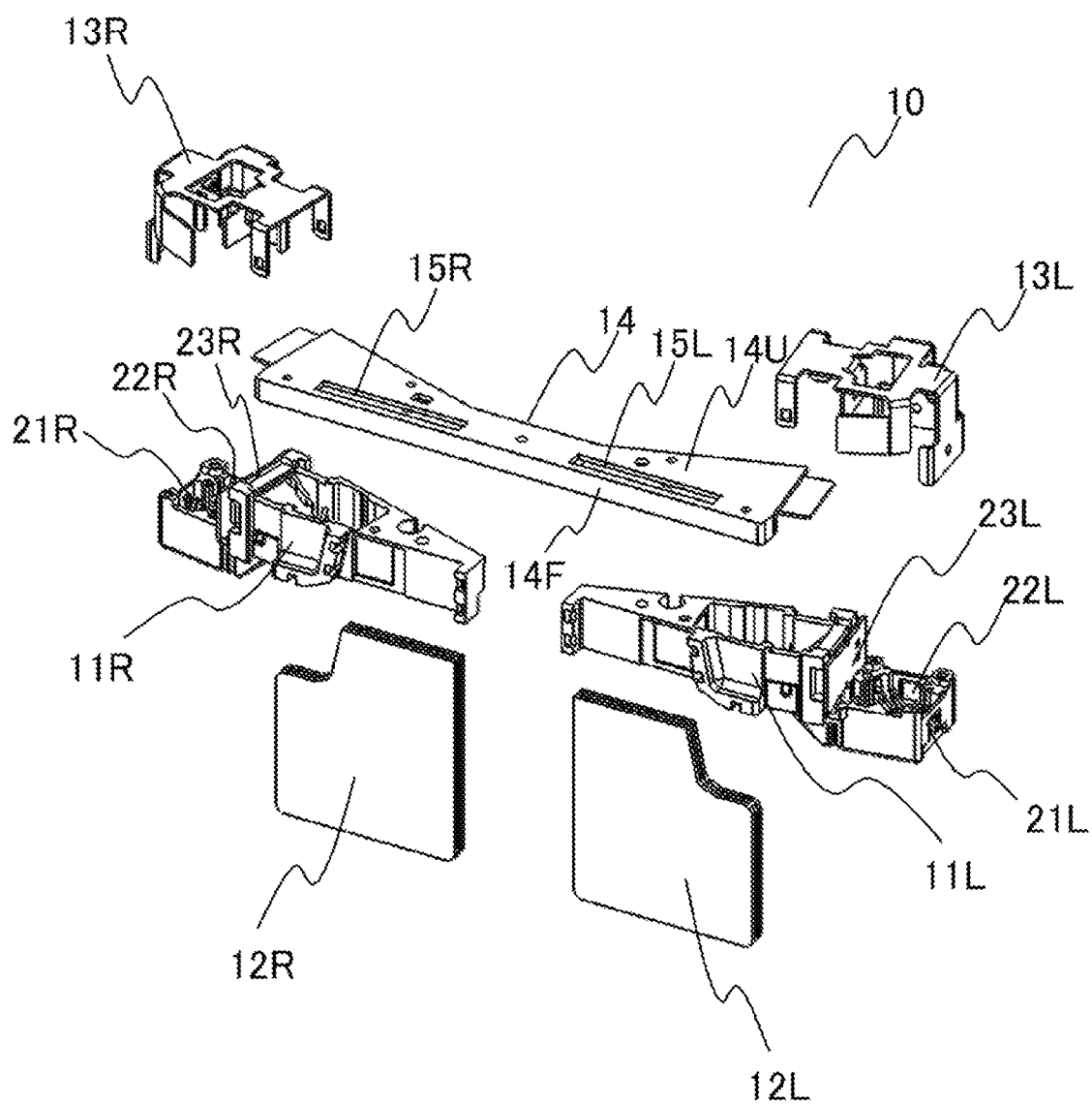
FIG. 3 is an exploded perspective view of the image projection optical module according to the first embodiment of the present invention.

FIG. 2 is a perspective view of an image projection optical module 10 provided in the casing 2 of the head mounted display 1. FIG. 3 is an exploded perspective view of the image projection optical module 10. In the present embodiment, images are to be displayed for the left and right eyes, respectively, and an optical case, an image display unit, and the like to be described later are present on each of left and right. The image projection optical module 10 includes optical cases 11L and 11R, image display units 12L and 12R, securing members 13L and 13R, and a coupling member 14 that couples the left and right optical cases 11L and 11R.

The optical case 11L is provided with two light sources 21L and 22L, an image generating element 23L, and optical components such as a lens and a prism (not illustrated). The optical case 11R are provided with two light sources 21R and 22R, an image generating element 23R, and optical components such as a lens and a prism (not illustrated).

The securing members 13L and 13R conduct heat generated from the light sources 21L, 22L, 21R, and 22R and the image generating elements 23L and 23R to the coupling member 14. The securing members 13L and 13R are in contact with both end portions of the coupling member 14, respectively.

The coupling member 14 is provided with an upper heat dissipation portion 14U on an upper portion of the coupling member 14 and a front heat dissipation portion 14F on a front portion of the coupling member 14. The upper heat dissipation portion 14U and the front heat dissipation portion 14F each serve as a portion for transferring, to the casing 2 of the head mounted display 1, heat conducted from the light sources 21L, 22L, 21R, and 22R and the image generating elements 23L and 23R. Furthermore, the coupling member 14 has openings 15L and 15R. The image display units 12L and 12R are mounted to the optical cases 11L and 11R, with upper end portions of the image display units 12L and 12R inserted in the openings 15L and 15R, respectively. Disposition of the front heat dissipation portion 14F of the coupling member 14 ahead of the openings 15L and 15R allows the front heat dissipation portion 14F of the coupling member 14 to be provided ahead of the image display unit 12L and 12R.

Figure 4:
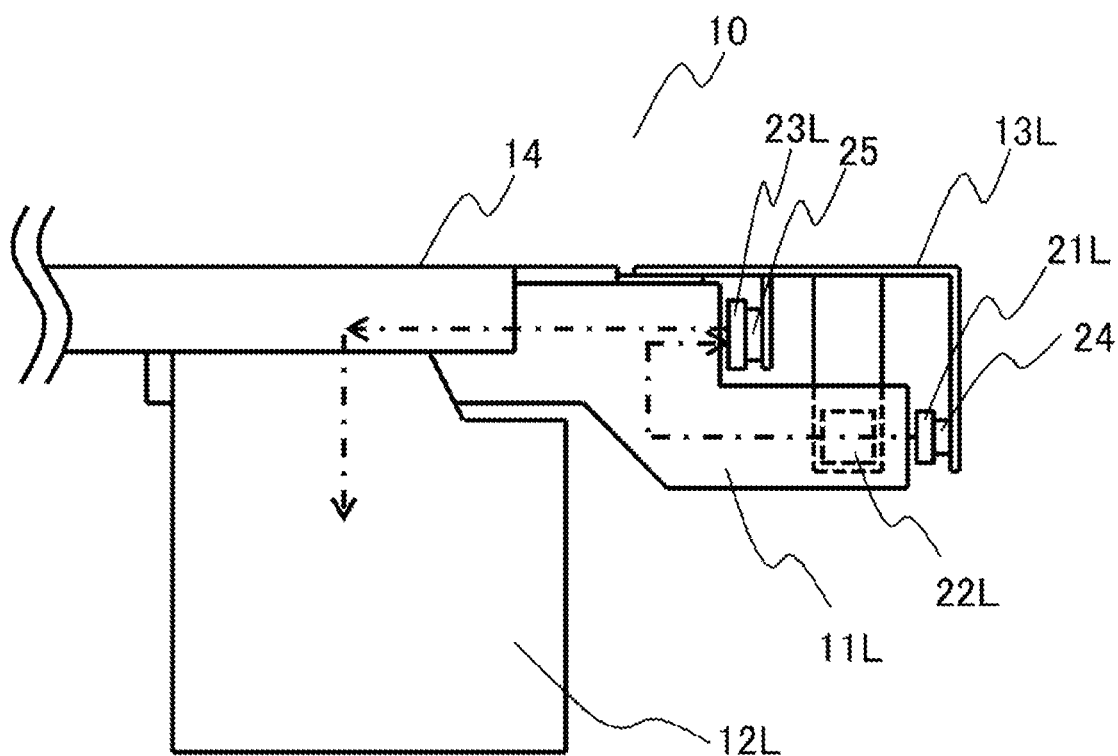
FIG. 4 is an explanatory view of an optical path in the image projection optical module according to the first embodiment of the present invention.

FIG. 4 is an explanatory view of an optical path from the light sources to the image display unit in the image projection optical module 10. Note that FIG. 4 illustrates a left side portion of the left and right configurations; however, a right side portion is similar in configuration to the left side portion. Light emitted from the light sources 21L and 22L is guided into the image generating element 23L through for example, a lens and a prism (not illustrated) provided in the optical case 11L. Light imparted with image information by the image generating element 23L passes through the optical case 11L, and the resulting light is incident on the image display unit 12L through, for example, the prism (not illustrated). The image display unit 12L includes a diffraction grating that allows in-plane capturing of the light to the image display unit, a waveguide that allows in-plane guiding of the light, and a diffraction grating that emits light in the direction of the user's eyes. As a result, the image information is displayed to the user.

Examples of such a light source that is used include a light emitting diode and examples of such an image generating element that is used include a liquid crystal panel. The light sources 21L and 22L are connected to the securing member 13L through a heat conducting member 24, and the image generating element 23L is connected to the securing member 13L through a heat conducting member 25. Thus, the light sources 21L and 22L and the image generating element 23L are thermally connected to the coupling member 14 through the heat conducting members 24 and 25 and the securing member 13L.

Figure 5:
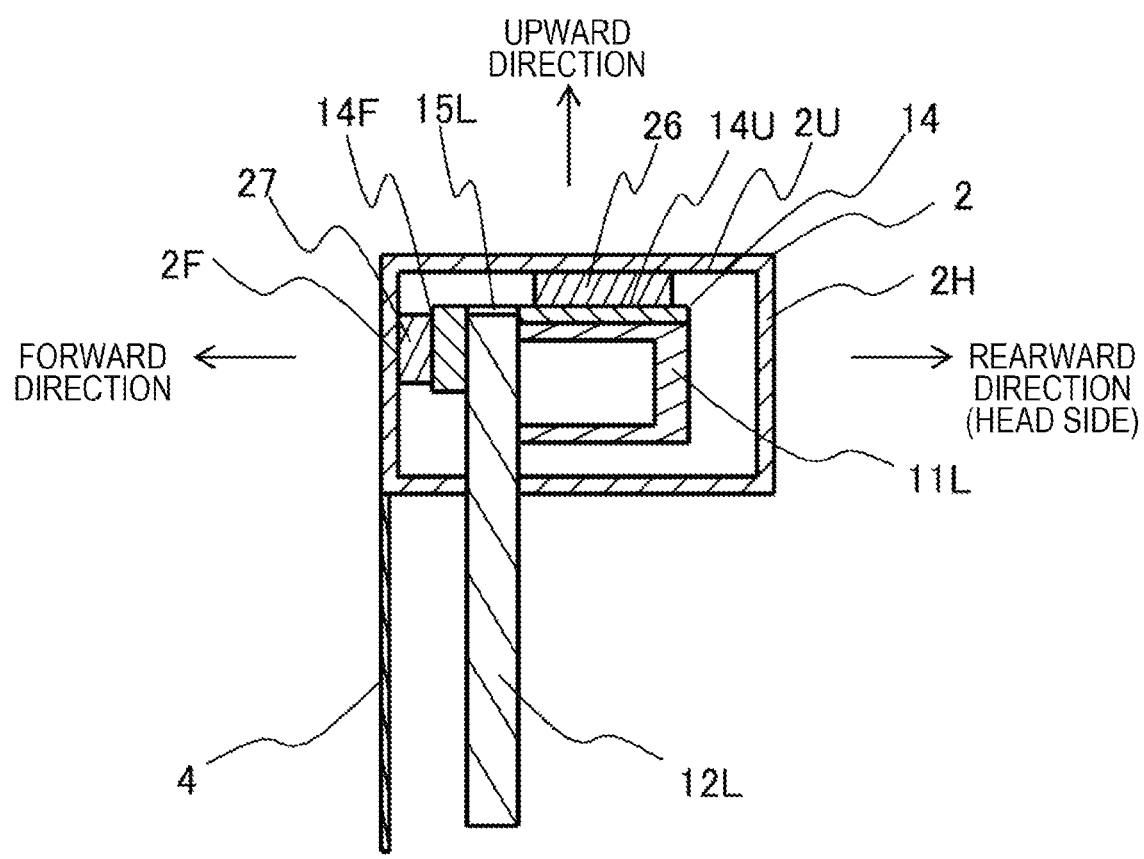
FIG. 5 is a cross-sectional view of the image projection optical module according to the first embodiment of the present invention and the head mounted display including the image projection optical module.

FIG. 5 is a cross-sectional view taken along line A-A in FIG. 1 and is an explanatory view of the connection between the coupling member 14 of the image projection optical module 10 and the casing 2 of the head mounted display 1. Note that FIG. 5 illustrates a left side portion of the left and right configurations; however, a right side portion is similar in configuration to the left side portion.

The upper heat dissipation portion 14U of the coupling member 14 is thermally connected to an inner face 2U of an upper portion of the casing 2 of the head mounted display 1 through a heat conducting member 26. The front heat dissipation portion 14F of the coupling member 14 is thermally connected to an inner face 2F of a front portion of the casing 2 of the head mounted display 1 though a heat conducting member 27.

With the above configuration, the heat generated from the light sources 21L, 22L, 21R, and 22R and the image generating elements 23L and 23R of the image projection optical module 10 efficiently transfer to the upper portion and the front portion of the casing 2 of the head mounted display 1 through the securing members 13L and 13R and the coupling member 14 to dissipate externally. The securing members 13L and 13R and the coupling member 14 may be integrally formed.

Figure 6:
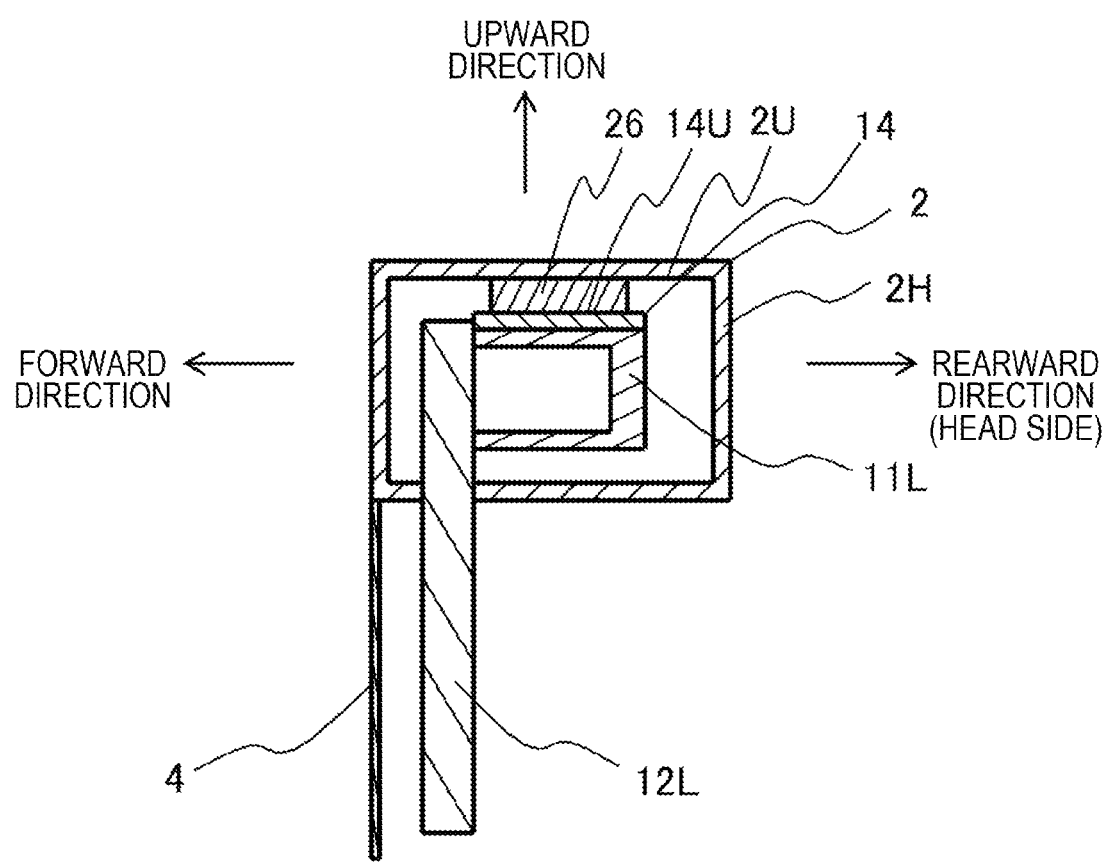
FIG. 6 is a cross-sectional view of an image projection optical module in a conventional example and a head mounted display including the image projection optical module.

As a comparison, FIG. 6 illustrates the connection between a coupling member 14 of an image projection optical module and a casing 2 of a head mounted display in a conventional example. In the conventional example, a front heat dissipation portion of the coupling member 14 is not provided, and an upper heat dissipation portion 14U of the coupling member 14 is connected to an inner face 2U of an upper portion of the casing 2 through a heat conducting member 26. In this case, heat transferred from a light source and an image generating element through a securing member and the coupling member concentratedly transfers to the upper portion of the casing 2 of the head mounted display. This results in a remarkable rise in the temperature of the upper portion of the casing 2 of the head mounted display. Furthermore, a short heat transfer path to a head side 2H adjacent to the upper portion of the casing 2 of the head mounted display causes a rise in temperature on a head side 2H of the casing 2 of the head mounted display.

On the other hand, in the present embodiment, as a heat transfer path from the coupling member 14 to the casing 2 of the head mounted display 1, there is provided a path for transfer from the front heat dissipation portion 14F to the inner face 2F of the front portion of the casing 2 of the head mounted display 1, in addition to a path for transfer from the upper heat dissipation portion 14U to the inner face 2U of the upper portion of the casing 2 of the head mounted display 1. This arrangement allows reduction in heat transfer to the head side 2H of the casing 2 of the head mounted display 1, whereby there can be inhibited a rise in temperature on the head side 2H of the casing 2 of the head mounted display 1.

As described above, according to the present embodiment, there can be provided the image projection optical module for the head mounted display, the image projection optical module including the coupling member thermally connecting the light sources and the image generating elements of the image projection optical module, the front portion and the upper portion of the coupling member being thermally connected to the inner face of the front portion and the inner face of the upper portion of the casing of the head mounted display, respectively, thereby inhibiting a rise in temperature on the head side of the casing of the head mounted display.

Second Embodiment

Next, an image projection optical module according to a second embodiment of the present invention will be described.

Figure 7:
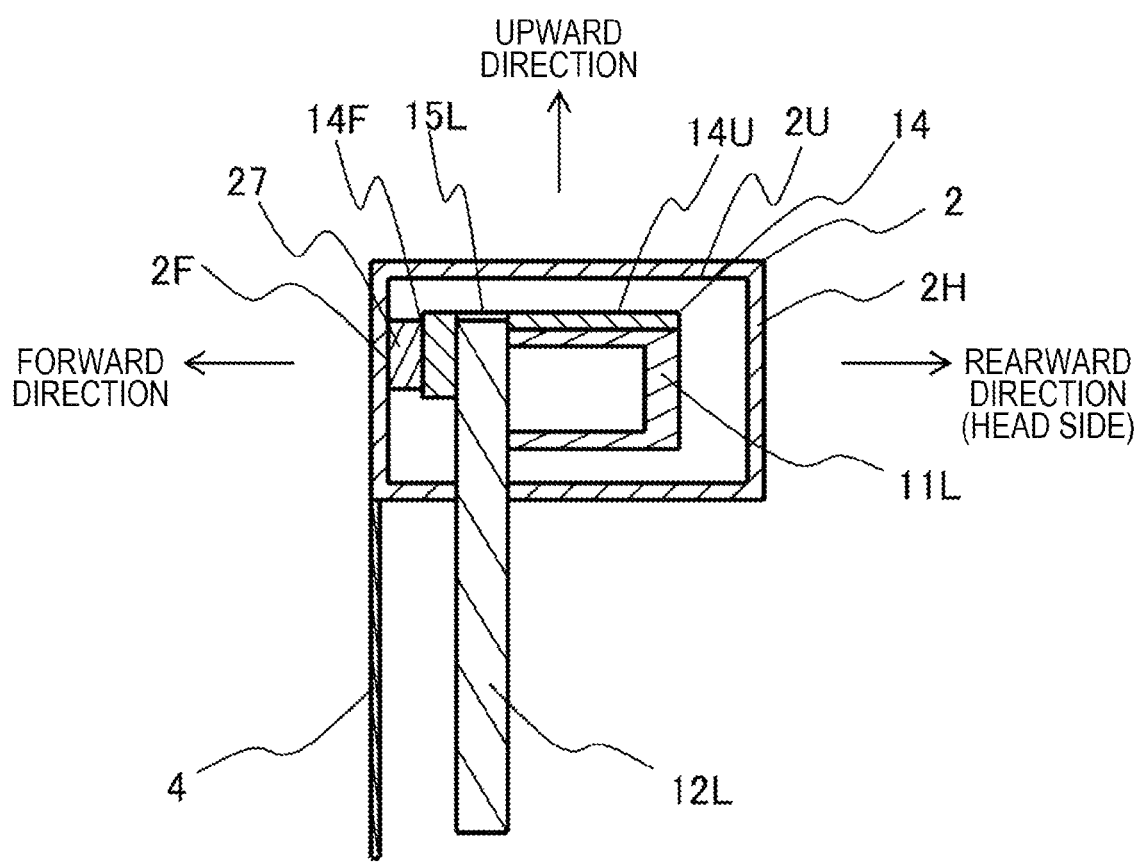
FIG. 7 is a cross-sectional view of an image projection optical module according to a second embodiment of the present invention and a head mounted display including the image projection optical module.

FIG. 7 is a cross-sectional view similar to FIG. 5, and is an explanatory view of the connection between a coupling member 14 of the image projection optical module and a casing 2 of a head mounted display. Note that FIG. 7 illustrates a left side portion of the left and right configurations; however, a right side portion is similar in configuration to the left side portion.

In the present embodiment, there is not provided a heat conducting member that connects an upper heat dissipation portion 14U of the coupling member 14 and an inner face 2U of an upper portion of the casing 2 of the head mounted display. A front heat dissipation portion 14F of the coupling member 14 is thermally connected to an inner face 2F of a front portion of the casing 2 of the head mounted display through a heat conducting member 27. The other configuration is the same as in the first embodiment.

In the present embodiment, heat generated from light sources and image generating elements of the image projection optical module transfers to the inner face 2F of the front portion of the casing 2 of the head mounted display through securing members and the front heat dissipation portion 14F of the coupling member 14 to dissipate externally. A heat transfer path from the coupling member 14 to the casing 2 of the head mounted display is limited to the front portion of the casing 2. Thus, the temperature of the light sources and the image generating elements rises as compared with the first embodiment. On the other hand, the heat transfer to the front portion of the casing 2 of the head mounted display allows further inhibition of a rise in temperature on the head side 2H away from the front portion of the casing 2 of the head mounted display. In addition, there is not provided a heat conducting member that connects the upper heat dissipation portion 14U of the coupling member 14 and the inner face 2U of the upper portion of the casing 2 of the head mounted display, thereby bringing cost reduction.

In views of above, as long as the rise in the temperature of the light sources and the image generating elements is within an allowable range, locations where the coupling member 14 of the image projection optical module and the casing 2 of the head mount display are thermally connected are limited to the front heat dissipation portion 14F of the coupling member 14 and the inner face 2F of the front portion of the casing 2 of the head mounted display. Such an arrangement allows a remarkable inhibition of the rise in temperature on the head side 2H of the casing 2 of the head mounted display.

Third Embodiment

Next, an image projection optical module according to a third embodiment of the present invention will be described.

Figure 8:
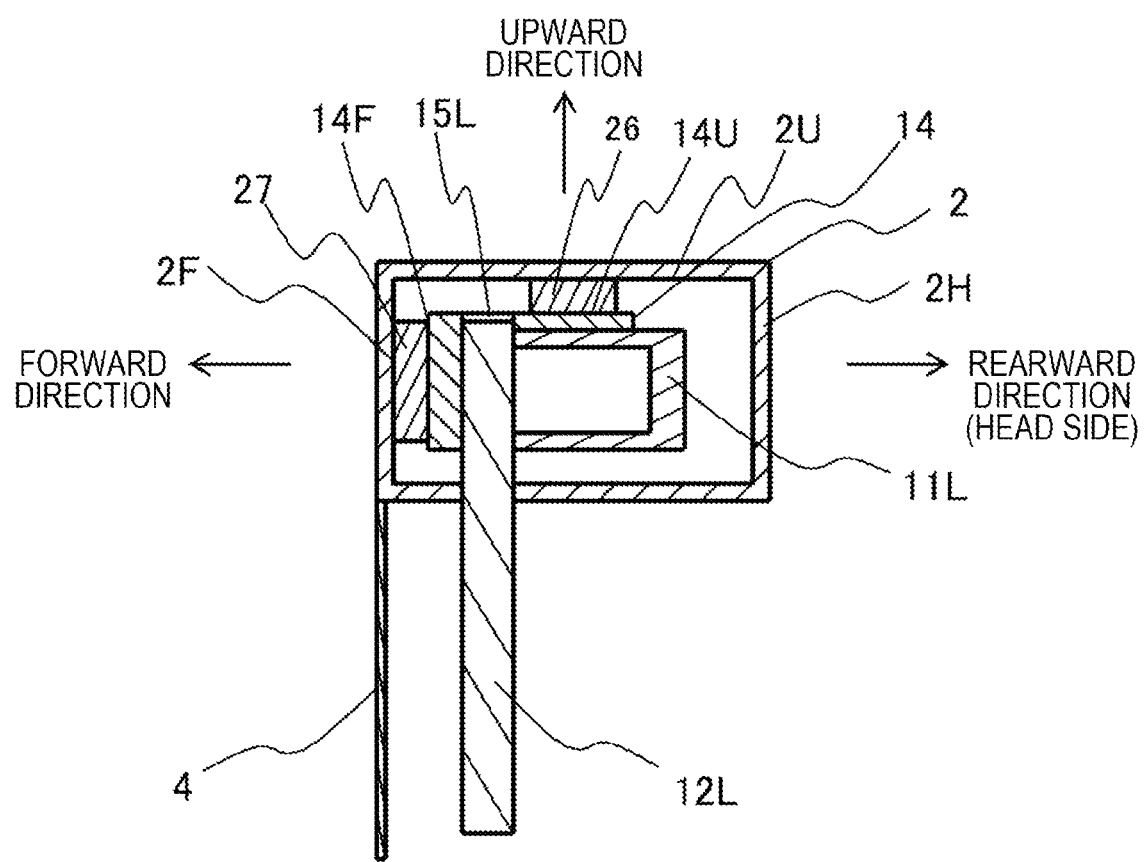
FIG. 8 is a cross-sectional view of an image projection optical module according to a third embodiment of the present invention and a head mounted display including the image projection optical module.

FIG. 8 is a cross-sectional view similar to FIG. 5, and is an explanatory view of the connection between a coupling member 14 of the image projection optical module and a casing 2 of a head mounted display. Note that FIG. 8 illustrates a left side portion of the left and right configurations; however, a right side portion is similar in configuration to the left side portion.

In the present embodiment, a front heat dissipation portion 14F of the coupling member 14 connected to an inner face 2F of a front portion of the casing 2 of the head mounted display through a heat conducting member 27 is formed larger in area than an upper heat dissipation portion 14U of the coupling member 14 connected to an inner face 2U of an upper portion of the casing 2 of the head mounted display through a heat conducting member 26. The other configuration is the same as in the first embodiment. This arrangement allows heat transferred to the inner face 2F of the front portion of the casing 2 of the head mounted display to be larger than heat transferred to the inner face 2U of the upper portion of the casing 2 of the head mounted display.

In the present embodiment, heat transferred from the upper heat dissipation portion 14U of the coupling member 14 to the inner face 2U of the upper portion of the casing 2 of the head mounted display is smaller than that in the first embodiment and larger than that in the second embodiment. Thus, there can be enhanced an effect of inhibiting a rise in temperature on the head side 2H of the casing 2 of the head mounted display, while having an effect of inhibiting a rise in the temperature of light sources and image generating elements.

Fourth Embodiment

Next, an image projection optical module according to a fourth embodiment of the present invention will be described.

Figure 9:
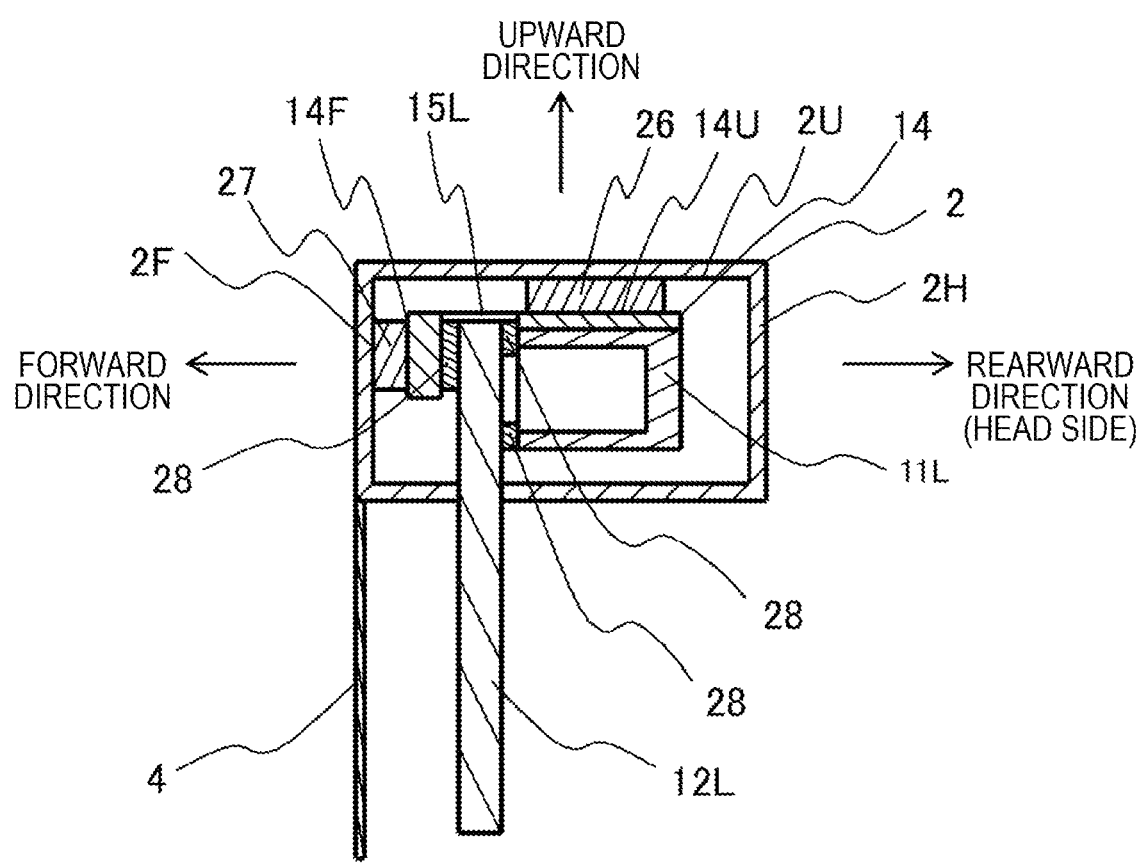
FIG. 9 is a cross-sectional view of an image projection optical module according to a fourth embodiment of the present invention and a head mounted display including the image projection optical module.

FIG. 9 is a cross-sectional view similar to FIG. 5, and is an explanatory view of the connection between a coupling member 14 of the image projection optical module and a casing 2 of a head mounted display, and the connection between an image display unit 12L, an optical case 11L, and the coupling member 14. Note that FIG. 9 illustrates a left side portion of the left and right configurations; however, a right side portion is similar in configuration to the left side portion.

In the present embodiment, with the image display unit 12L inserted in an opening 15L of the coupling member 14, a front heat dissipation portion 14F of the coupling member 14 and the image display unit 12L have an adiabatic member 28 therebetween, and an upper heat dissipation portion 14U and the image display unit 12L have an adiabatic member 28 therebetween, each adiabatic member 28 being lower in thermal conductivity than the coupling member 14. Furthermore, the optical case 11L and the image display unit 12L have an adiabatic member 28 therebetween. The other configuration is the same as in the first embodiment.

The image display unit 12L includes a diffraction grating, and a variation in the pitch of the diffraction grating due to thermal deformation leads to display image disturbance. In the present embodiment, providing of the adiabatic members 28 between the optical case 11L, the coupling member 14, and the image display unit 12L reduces heat transferred from the optical case 11L and the coupling member 14 to the image display unit 12L. Thus, there can be inhibited a rise in the temperature of the image display unit 12L, thereby allowing reduction in such display image disturbance.

Fifth Embodiment

Next, an image projection optical module according to a fifth embodiment of the present invention will be described.

Figure 10:
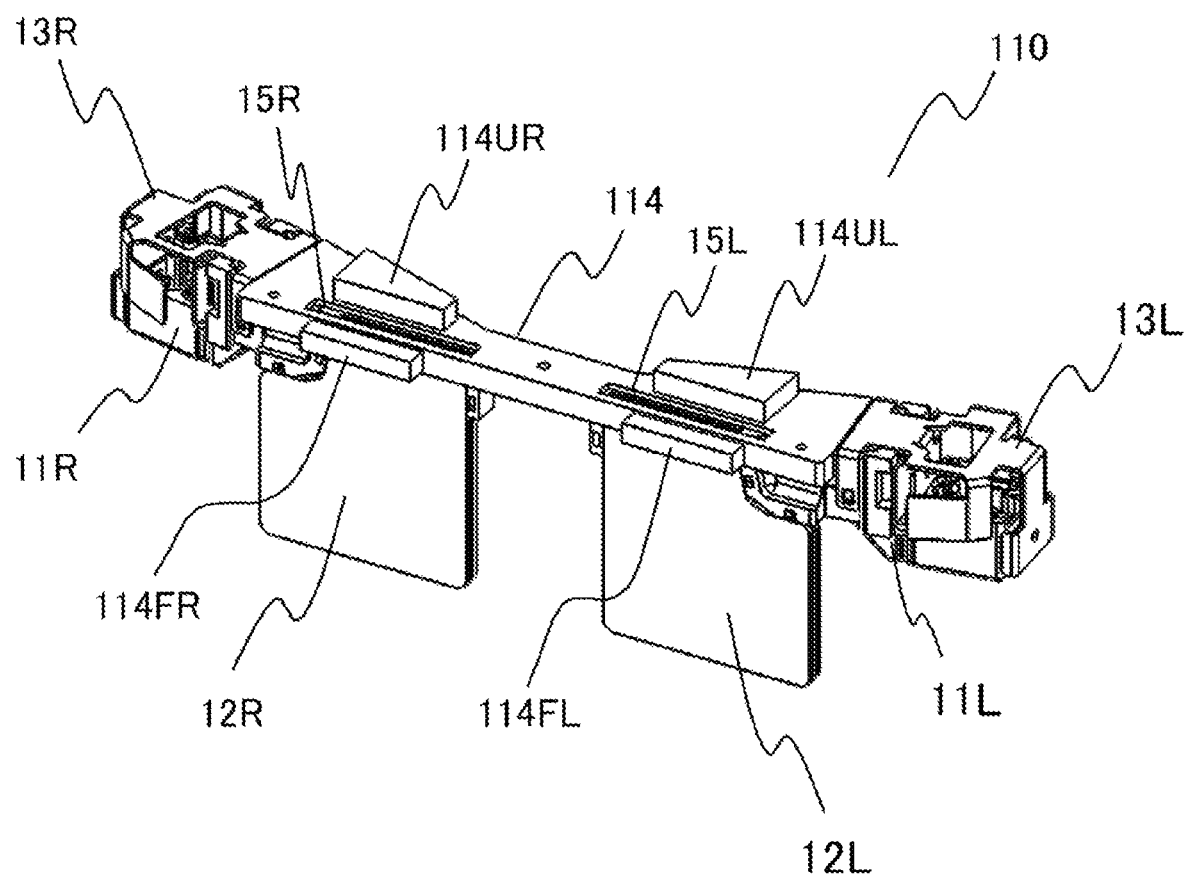
FIG. 10 is a perspective view of an image projection optical module according to a fifth embodiment of the present invention.

FIG. 10 is a perspective view of an image projection optical module 110. In the present embodiment, front heat dissipation portions 114FL and 114FR of a coupling member 114 protrude forward, and upper heat dissipation portions 114UL and 114UR of the coupling member 114 protrude upward.

Figure 11:
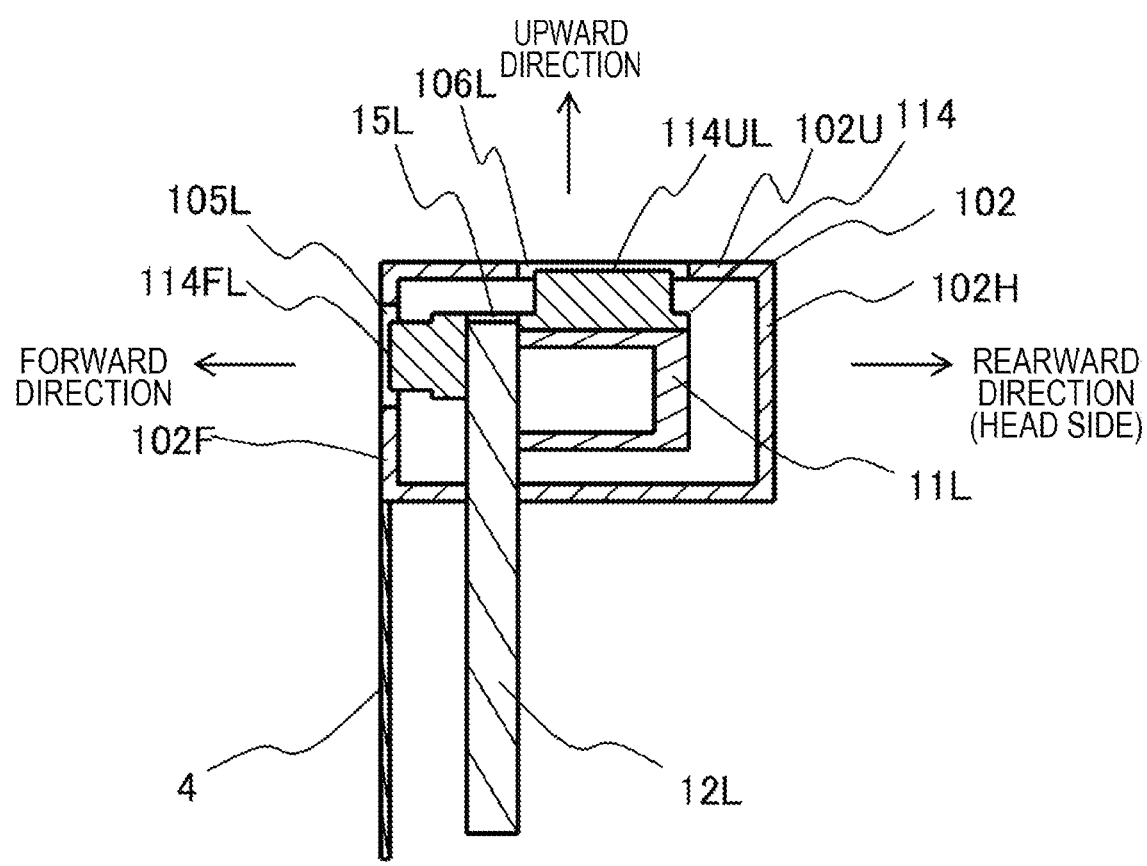
FIG. 11 is a cross-sectional view of the image projection optical module according to the fifth embodiment of the present invention and a head mounted display including the image projection optical module.

FIG. 11 is a cross-sectional view similar to FIG. 5, and is an explanatory view of the connection between the coupling member 114 of the image projection optical module 110 and a casing 102 of a head mounted display. Note that FIG. 11 illustrates a left side portion of the left and right configurations; however, a right side portion is similar in configuration to the left side portion.

A front portion 102F of the casing 102 of the head mounted display has an opening 105L, and an upper portion 102U of the casing 102 of the head mounted display has an opening 106L. The opening 105L of the front portion of the casing 102 of the head mounted display allows external exposure of the front heat dissipation portion 114FL of the coupling member 114 of the image projection optical module 110. The opening 106L of the upper portion of the casing 102 of the head mounted display allows external disposure of the upper heat dissipation portion 114UL of the coupling member 114 of the image projection optical module 110.

Note that FIG. 11 exemplifies that the openings 105L and 106L of the casing 102 of the head mounted display are open to the entire regions of the front heat dissipation portion 114FL and the upper heat dissipation portion 114UL of the coupling member 114 of the image projection optical module 110, respectively. The openings 105L and 106L of the casing 102 of the head mounted display, however, may each have a shape partially open like a mesh shape.

Figure 12:
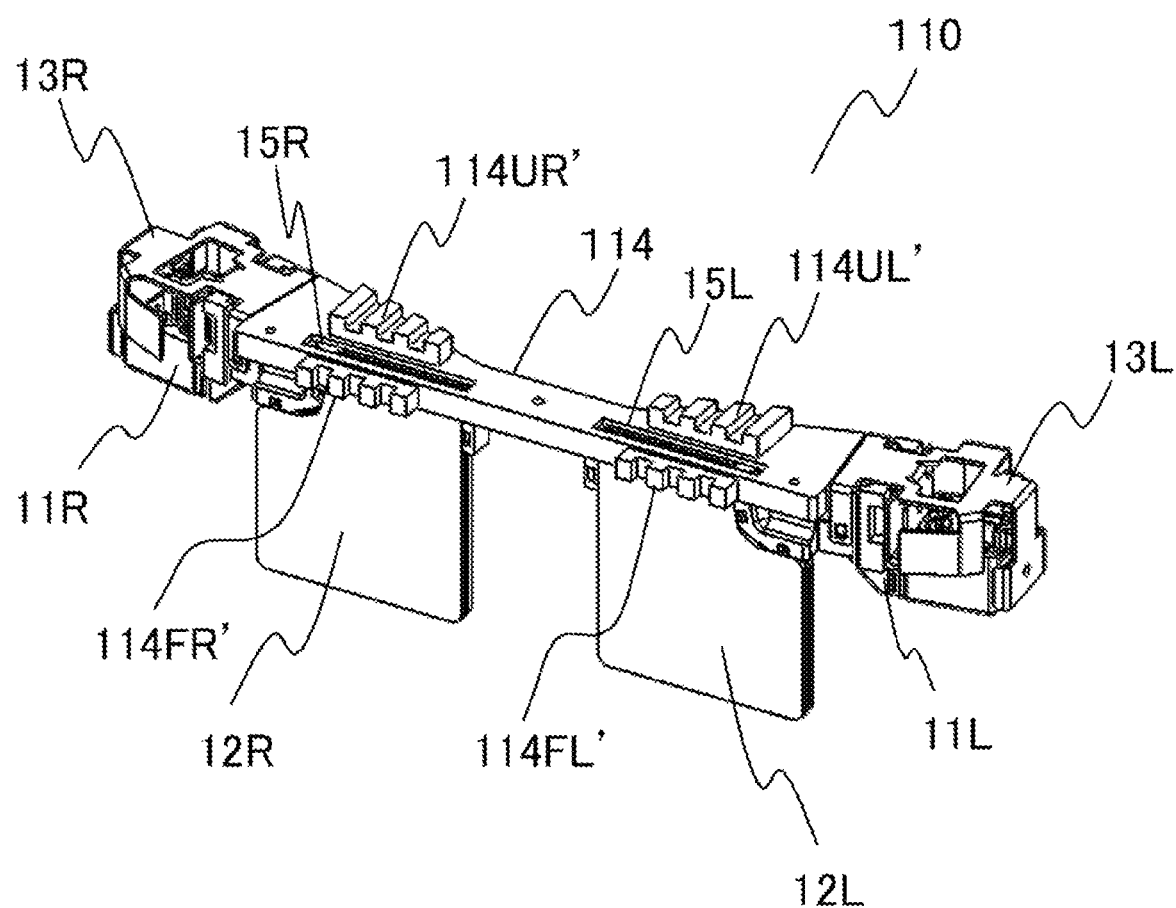
FIG. 12 is a view of another shape of a heat dissipation portion in the image projection optical module according to the fifth embodiment of the present invention.

Furthermore, instead of the front heat dissipation portions and the upper heat dissipation portions of the coupling member 114 of the image projection optical module 110, there may be provided front heat dissipation portions 114FL' and 114FR' and upper heat dissipation portions 114UL' and 114UR' each having a fin shape as illustrated in FIG. 12. The providing of the fin shape as described above allows further enhancement of the effect of external heat dissipation.

As a result, heat transferred from light sources and image generating elements dissipates directly externally from the coupling member 114 of the image projection optical module 110, thereby allowing reduction in heat transfer to the casing 102 of the head mounted display. Therefore, there can be inhibited a rise in temperature on the head side 102H of the casing 102 of the head mounted display.

In each of the above embodiment, a liquid crystal panel is exemplarily described as an image generating element; however, examples of the image generating elements 23L and 23R that also can be used include an organic electroluminescent (EL) panel serving as a self-luminous element. Such an organic EL panel serving a self-luminous element eliminates the use of the light sources 21L, 21R, 22L, and 22R.

Note that the present invention is not limited to the above embodiments and includes various modifications. For example, the above embodiments have been described in detail in order to facilitate understanding of the present invention, and are not necessarily limited to those having all the configurations that have been described. In addition, part of the configuration of an embodiment can be replaced with the configuration of another embodiment. Furthermore, the configuration of an embodiment can be added to the configuration of another embodiment. Furthermore, for part of the configuration of each embodiment, addition, deletion, and replacement of the configuration of another embodiment can be made.

What is claimed is:

1. An image projection optical module comprising: an image generating element configured to generate an image; an image display unit configured to display the image; and
   a coupling member thermally connected to the image generating element,
   wherein the coupling portion including a front heat dissipation portion on a front portion of the coupling member when a direction of line of sight of a user wearing a casing of a head mounted display provided with the image projection optical module is defined as a forward direction, the front heat dissipation portion being to dissipate heat, and
   wherein the coupling member has an opening in which the image display unit is inserted, and an adiabatic member is provided between the coupling member and the image display unit, the adiabatic member being lower in thermal conductivity than the coupling member.

2. The image projection optical module according to claim 1,
   wherein the front heat dissipation portion of the coupling member is thermally connected to an inner face of a front portion of the casing of the head mounted display provided with the image projection optical module.

3. The image projection optical module according to claim 1,
   wherein the coupling member further includes an upper heat dissipation portion on an upper portion of the coupling member when a head top side of the user wearing the casing of the head mounted display is defined as an upper direction, the upper heat dissipation portion being to dissipate heat.

4. The image projection optical module according to claim 1,
   wherein the front heat dissipation portion of the coupling member is disposed ahead of the image display unit.

5. The image projection optical module according to claim 1,
   wherein the coupling member has an opening in which the image display unit is inserted.

6. The image projection optical module according to claim 3,
   wherein the front heat dissipation portion of the coupling member is thermally connected to an inner face of a front portion of the casing of the head mounted display, and the upper heat dissipation portion of the coupling member is thermally connected to an inner face of an upper portion of the casing of the head mounted display.

7. The image projection optical module according to claim 6,
wherein the front heat dissipation portion of the coupling member thermally connected to the inner face of the front portion of the casing is larger in area than the upper heat dissipation portion of the coupling member thermally connected to the inner face of the upper portion of the casing.

8. The image projection optical module according to claim 1,
wherein the front heat dissipation portion of the coupling member protrudes forward from an opening of the casing of the head mounted display.

9. The image projection optical module according to claim 3,
wherein the front heat dissipation portion of the coupling member protrudes forward from an opening of the casing of the head mounted display, and
the upper heat dissipation portion of the coupling member protrudes upward from an opening of the casing of the head mounted display.

10. The image projection optical module according to claim 9,
wherein a front of the front heat dissipation portion has a fin shape, and a top of the upper heat dissipation portion has a fin shape.

11. The image projection optical module according to claim 1, further comprising:
a left optical case and a right optical case each housing the image generating element,
wherein the coupling member couples the left optical case and the right optical case.

12. The image projection optical module according to claim 1, further comprising:
a light source configured to irradiate the image generating element with light,
wherein the light source is thermally connected to the coupling member.

13. The image projection optical module according to claim 1,
wherein the image generating element serves as a liquid crystal panel or an organic electroluminescent (EL) panel.

14. A head mounted display comprising:
an image projection optical including an image generating element configured to generate an image; an image display unit configured to display the image; and
a coupling member thermally connected to the image generating element,
wherein the coupling portion including a front heat dissipation portion on a front portion of the coupling member when a direction of line of sight of a user wearing a casing of the head mounted display is defined as a forward direction, the front heat dissipation portion being to dissipate heat, and
wherein the coupling member has an opening in which the image display unit is inserted, and an adiabatic member is provided between the coupling member and the image display unit, the adiabatic member being lower in thermal conductivity than the coupling member.

15. An image projection optical module comprising: an image generating element configured to generate an image; an image display unit configured to display the image; and
a coupling member thermally connected to the image generating element,
wherein the coupling portion including a front heat dissipation portion on a front portion of the coupling member when a direction of line of sight of a user wearing a casing of a head mounted display provided with the image projection optical module is defined as a forward direction, the front heat dissipation portion being to dissipate heat,
wherein the coupling member further includes an upper heat dissipation portion on an upper portion of the coupling member when a head top side of the user wearing the casing of the head mounted display is defined as an upper direction, the upper heat dissipation portion being to dissipate heat,
wherein the front heat dissipation portion of the coupling member protrudes forward from an opening of the casing of the head mounted display, and
wherein the upper heat dissipation portion of the coupling member protrudes upward from an opening of the casing of the head mounted display.

* * * * *